United States Patent
DiStefano et al.

(10) Patent No.: US 6,867,977 B2
(45) Date of Patent: Mar. 15, 2005

(54) METHOD AND APPARATUS FOR PROTECTING THERMAL INTERFACES

(75) Inventors: Eric DiStefano, Livermore, CA (US); Je-Young Chang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/394,923

(22) Filed: Mar. 21, 2003

(65) Prior Publication Data

US 2004/0125564 A1 Jul. 1, 2004

Related U.S. Application Data

(63) Continuation-in-part of application No. 10/335,439, filed on Dec. 30, 2002, now abandoned.

(51) Int. Cl.$^7$ ................................................. H05K 7/20
(52) U.S. Cl. ........................ 361/705; 361/704; 257/675; 257/787; 257/788
(58) Field of Search ........................ 361/703, 704–707, 361/709; 257/706, 712, 718; 174/16.1; 165/80.3, 185

(56) References Cited

U.S. PATENT DOCUMENTS

| | | | | |
|---|---|---|---|---|
| 5,744,863 A | * | 4/1998 | Culnane et al. ............. 257/712 |
| 6,040,631 A | * | 3/2000 | Dibble et al. ............... 257/783 |
| 6,197,859 B1 | * | 3/2001 | Green et al. ................ 524/270 |
| 6,229,204 B1 | * | 5/2001 | Hembree .................... 257/675 |
| 6,236,568 B1 | * | 5/2001 | Lai et al. .................... 361/704 |
| 6,306,686 B1 | * | 10/2001 | Horton et al. ............. 438/122 |
| 6,601,294 B1 | * | 8/2003 | Jiang et al. .................. 29/841 |
| 2003/0085475 A1 | * | 5/2003 | Im et al. ..................... 257/796 |

* cited by examiner

*Primary Examiner*—Boris Chérvinsky
(74) *Attorney, Agent, or Firm*—Blakely, Sokoloff, Taylor & Zafman LLP

(57) ABSTRACT

A protective layer and an encapsulant for a thermal interface are disclosed. In one embodiment, an apparatus has a heat generating device, a heat dissipating device, a thermal interface between the heat generating and heat dissipating devices, and an encapsulant covering the thermal interface. In another embodiment, layers of grease are applied between the thermal interface and at least one of the heat generating and heat dissipating devices. In a further embodiment, a method comprises encapsulating a thermal interface in an encapsulant to protect the thermal interface. In another embodiment, a method comprises applying a first layer of grease between a heat generating device and a thermal interface and a second layer of grease between a heat dissipating device and the thermal interface.

25 Claims, 4 Drawing Sheets

METHOD AND APPARATUS FOR PROTECTING THERMAL INTERFACES

This application is a continuation-in-part of U.S. patent application Ser. No. 10/335,439, filed Dec. 30, 2002 now abandoned.

FIELD

Embodiments of the present invention relate to heat management and more particularly to heat management using thermal interfaces.

BACKGROUND

Heat management can be critical in many applications. Excessive heat can cause damage to or degrade the performance of mechanical, chemical, electric, and other types of devices. Heat management becomes more critical as technology advances and newer devices continue to become smaller, and more complex, and as a result run hotter.

Modern electronic circuits, because of their high density and small size, often generate a substantial amount of heat. Complex integrated circuits (ICs), especially microprocessors, generate so much heat that they are often unable to operate without some sort of cooling system. Further, even if an IC is able to operate, excess heat can degrade an IC's performance and can adversely affect its reliability over time. Inadequate cooling can cause problems in central processing units (CPUs) used in personal computers (PCs), which can result in system crashes, lockups, surprise reboots, and other errors. The risk of such problems can become especially acute in the tight confines found inside laptop computers and other portable computing and electronic devices.

Prior methods for dealing with such cooling problems have included using heat sinks, fans, and combinations of heat sinks and fans attached to ICs and other circuitry in order to cool them. However, as microprocessors and other ICs become more complex, more powerful, and even smaller, and as a result generate more heat, new techniques are needed to improve system cooling, to in part increase the longevity of such circuitry and systems.

DETAILED DESCRIPTION

Figure 1:
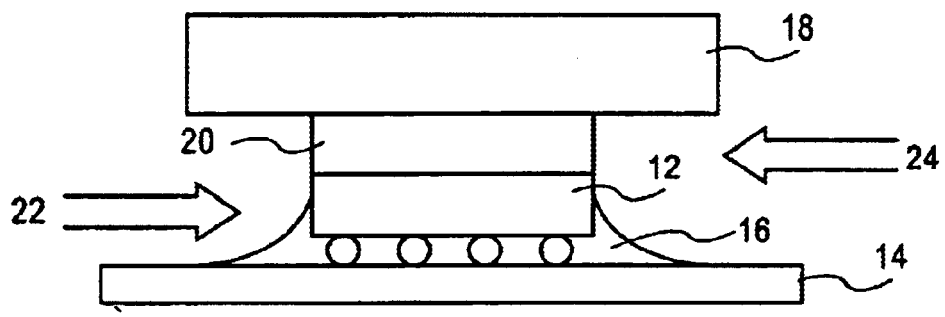
FIG. 1 illustrates an exemplary heat dissipating device.

FIG. 1 illustrates an exemplary heat dissipating device. A heat generating device 12 may be circuitry, such as an integrated circuit (IC), a processor, a central processing unit, a graphics processor, a chipset, or any other device that requires cooling. Further, the heat generating device 12 may be bare die circuitry. The heat generating device 12 is mounted upon a substrate 14 using under fill 16. A heat dissipating device 18 is used to cool the heat generating device 12. The heat dissipating device 18 may be a heat sink, a heat pipe, a heat spreader, a fan, a combination of a heat sink and a fan, or any other device appropriate for cooling the heat generating device 12. A thermal interface 20 is mounted in between the heat generating device 12 and the heat dissipating device 18. The thermal interface 20 transfers heat from the heat generating device 12 to the heat dissipating device 18. As shown in FIG. 1, the thermal interface 20 communicates with ambient air 22 and 24.

As illustrated in FIG. 1, the thermal interface 20 is applied directly to the heat generating device 12. The thermal interface 20 works well when first applied to the heat generating device 12 but shortly after use of the heat generating device 12 begins, the thermal interface 20 starts to degrade and as a result its cooling performance also degrades. Degradation of the thermal interface 20 can result in a reduction of cooling capacity in the heat dissipating device 18, and can further cause the heat generating device 12 to run hotter.

Exposure to ambient air and moisture can cause degradation in performance of the thermal interface 20. Further, the sustained temperature, bake, humidity, and cycling conditions often found in the environments in which heat generating devices exist can exacerbate the degradation. Exposure to ambient air can cause outgassing or chemical reactions with air or moisture and the polymers that often constitute thermal interfaces. The degradation of the thermal interface 20 can lead to reduction in the effectiveness of the heat dissipating device 18.

Figure 2A:
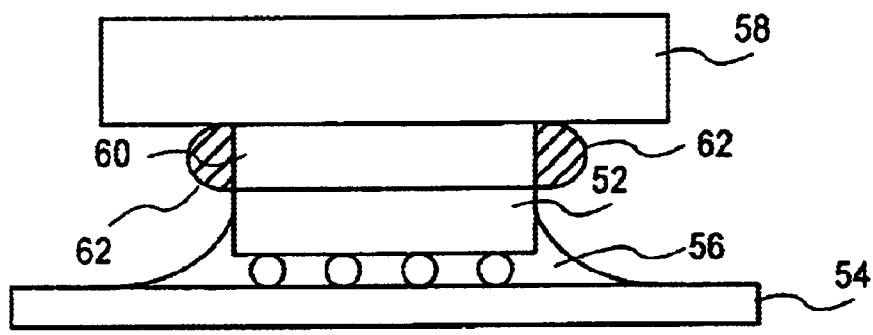
FIG. 2a illustrates an encapsulated thermal interface according to one embodiment.

FIG. 2a illustrates an encapsulated thermal interface according to one embodiment. An encapsulant can help to protect a thermal interface and eliminate degradation resulting from exposure to ambient air and moisture. As a result, encapsulating a thermal interface can help reduce the potential loss of its cooling properties over time due to exposure to ambient air and other environmental conditions.

As shown in FIG. 2a, the device 50 requires heat management. The device 50 has a heat generating device 52, a substrate 54, under fill 56, a heat dissipating device 58, a thermal interface 60, and an encapsulant 62. The heat generating device 52 is mounted upon the substrate 54 using under fill 56. The heat dissipating device 58 is used to cool the heat generating device 52. In one embodiment, the thermal interface 60 is a thermal attach interface and is used to attach the heat generating device 52 and the heat dissipating device 58, and as a result is mounted in between the heat generating device 52 and the heat dissipating device 58. The encapsulant 62 surrounds the thermal interface 60 according to one embodiment. It is understood that FIG. 2a shows a cross sectional view, and that according to one embodiment, the encapsulant 62 entirely surrounds the thermal interface 60. The encapsulant 62 helps to protect the thermal interface 60 from ambient air and other elements that may degrade the performance of the thermal interface 60. Further, according to another embodiment the encapsulant 62 may also surround the heat generating device 52 and the heat dissipating device 58 in order to help protect the heat generating device 52 and the heat dissipating device 58 in a manner similar to the way the encapsulant 62 helps protect the thermal interface 60.

The heat generating device 52 may be circuitry such as a bare die integrated circuit, bare die processor, a central processing unit (CPU), a chipset, a graphics processor or any other type of electronic device which requires cooling. Further, according to one embodiment, the heat generating device 52 is a CPU or other circuitry to be used in a mobile computer. Mobile computers, by their very nature have limited space and may have difficulty adequately cooling high power elements, and therefore cooling performance in mobile computing environments becomes critical. In another embodiment, the heat generating device 52 may be any heat generating device that requires cooling. The heat dissipating device 58 may be a heat sink, a heat pipe, a heat spreader, a fan, a combination of a heat sink and a fan, or any other cooling apparatus appropriate for cooling the heat generating device used.

The encapsulant 62 can be selected from a variety of materials of any type appropriate to encapsulate the thermal interface 60. For example, in one embodiment, the material can be a rigid, perhaps brittle material. Alternatively, a soft, flexible, material, such as shrink tube, grease, or polytetrafluoroethylene (PTFE) can be used as the encapsulant 62. Using a soft, flexible material can allow the encapsulant 62 to easily be manipulated after the encapsulant 62 has been applied.

Figure 2B:
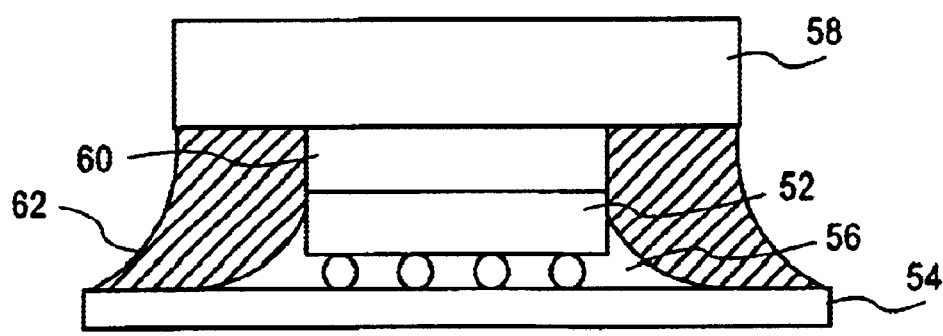
FIG. 2b illustrates an encapsulated thermal interface according to another embodiment.

FIG. 2b illustrates an encapsulated thermal interface according to another embodiment. Depending on the requirements of the heat generating device 52 and the method used for applying the encapsulant 62, the encapsulant 62 can cover or surround different parts of the device 50. As shown in FIG. 2a, the encapsulant 62 surrounds only the thermal interface 60. As illustrated in FIG. 2b, the encapsulant 62 surrounds not only the thermal interface 60, but also the heat generating device 52, and portions of the heat dissipating device 58. In other embodiments, the encapsulant 62 may be applied so as to surround the thermal interface 60, the heat generating device 52, and the heat dissipating device 58 in differing configurations according to the needs of the device 50.

Figure 3:
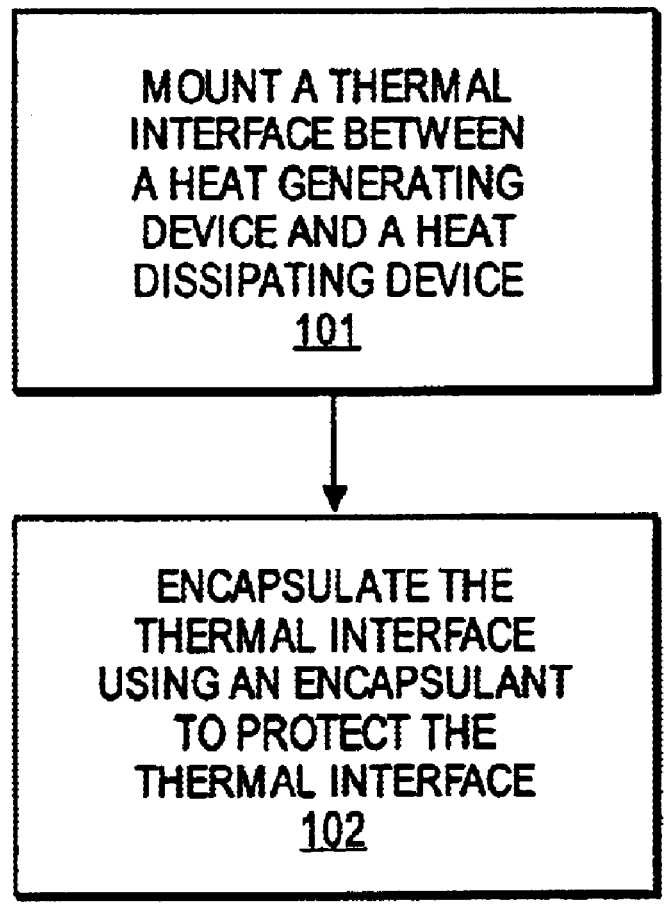
FIG. 3 is a flow chart showing a method for encapsulating a thermal interface according to one embodiment.

FIG. 3 is a flow chart showing a method for encapsulating a thermal interface according to one embodiment. In operation 101, a thermal interface is mounted between a heat generating device and a heat dissipating device, as in FIGS. 2a and 2b, above.

In operation 102, the thermal interface is encapsulated using an encapsulant to protect the thermal interface. According to another embodiment, a thermal interface in an already existing device can be encapsulated, and the mounting of operation 101 need not occur. As above, in one embodiment, the encapsulant is applied to protect the thermal interface from ambient air and other environmental factors. Also as above, the heat generating device can be a processor or other circuitry, and the heat dissipating device can be a heat sink or other appropriate device. The encapsulant can be a rigid material or a soft, flexible material. The encapsulant can be applied using a brush, a squeeze tube, a spray, or any other method that is appropriate for application of the material being used as the encapsulant.

Further, as above, the encapsulant may be applied in a manner such that it protects and covers only the thermal interface or such that it also protects and covers the heat generating device and the heat dissipating device. Also, the encapsulant, according to another embodiment, may comprise such a material that it can be applied to the thermal interface and other components, and later modified.

Figure 4:
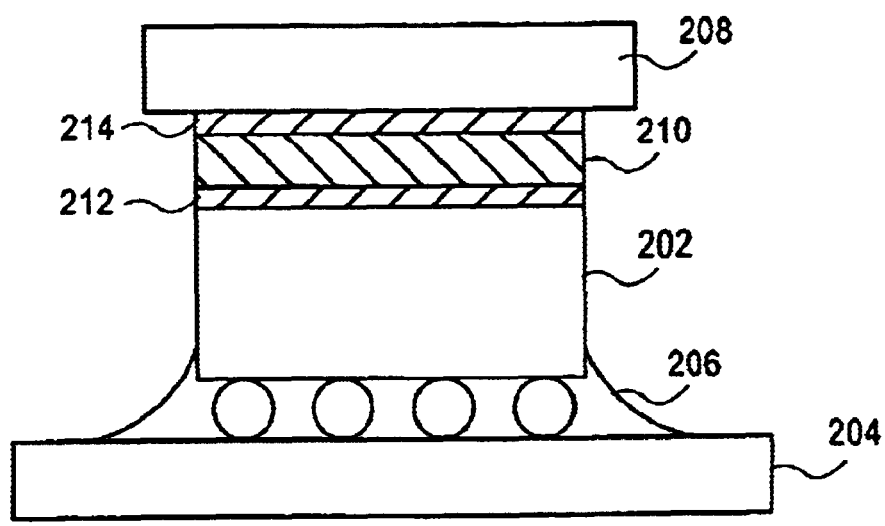
FIG. 4 illustrates a thermal interface protected by layers of grease.

FIG. 4 illustrates a thermal interface protected by layers of grease. System 200 comprises a heat generating device 202, which is mounted upon a substrate 204 using underfill 206. The heat generating device 202 can be an IC, such as a CPU, a graphics processor, or a chipset. A heat dissipating device 208 removes heat from the heat generating device 202. The heat dissipating device can be a heat sink, a heat spreader, a fan, a combination of a heat sink and fan, a heat pipe, or any other appropriate device. A thermal interface 210 is mounted in between the heat generating device 202 and the heat dissipating device 208. The thermal interface 210 can help to improve heat transfer from the heat generating device 202 to the heat dissipating device 208 by filling in irregularities on the mating surfaces of the heat generating device 202 and the heat dissipating device 208. In one embodiment, the thermal interface 210 can be a metallic alloy such as a eutectic material in a liquid phase or an off-eutectic material in a liquid-solid phase.

When the heat generating device 202 is operating, thermal expansion and contraction of the heat generating device 202 can create thermal and mechanical stresses on the thermal interface 210, which can eventually result in damage to the thermal interface 210. Layers of grease 212 and 214, which are applied between the thermal interface 210 and the heat generating device 202 and the heat dissipating device 208 respectively, can help to reduce any damage caused by thermal and mechanical stresses. In one embodiment, the layers of grease 212 and 214 are applied to the mating surfaces of the heat generating device 202 and the heat dissipating device 208 rather than directly to the thermal interface 210. In a further embodiment, the layers of grease 212 and 214 comprise a highly viscous grease oil. In another embodiment, the layers of grease 212 and 214 are very thin in comparison to the other components of the device 200 in order to minimize interference resistance. In a further embodiment, the layers of grease 212 and 214 can be applied so as to encapsulate the thermal interface 210, in order to further protect the thermal interface 210. Also, only one of the layers of grease 212 and 214 need be applied, depending on the requirements of the application.

The layers of grease 212 and 214 provide a buffer between the heat generating device 202 and the thermal interface 210, reducing the intensity of the heat transferred to the thermal interface 210, and thereby reducing the amount of thermal stress on the thermal interface 210. Further, the layers of grease oil 212 and 214 can allow the heat generating device 202 to slide relative to the thermal interface while it is expanding and contracting. The layers of grease oil 212 and 214 are much less rigid than the thermal interface 210, and therefore will absorb the stresses caused by movement of the heat generating device 202. In this way, the mechanical stresses cause by the movement of the heat generating device 202 are not felt by the thermal interface 210.

In one embodiment, the base of the heat dissipating device 208 can comprise copper. If the thermal interface 210 is metallic, a chemical reaction between the thermal interface 210 and the copper base of the heat dissipating device 208 can occur, which can result in the formation of an inter-metallic layer at the junction between the thermal interface 210 and the heat dissipating device 208. An inter-metallic layer is generally brittle and has low conductivity, so when an inter-metallic layer has formed, the ability of the thermal interface 210 to transfer heat to the heat dissipating device is reduced. Prior solutions to this problem have included sputtering a nickel layer on the copper surface to prevent the reaction. However, adding a nickel layer can be expensive. Instead, the layers of grease 212 and 214 can also prevent this unwanted chemical reaction and are inexpensive to apply. The layers of grease 212 and 214 act as a reaction barrier for metallic thermal interfaces, preventing unwanted chemical reactions.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. An apparatus, comprising:
   a heat generating device;
   a heat dissipating device over the heat generating device;
   a thermal interface coupled between the heat generating device and the heat dissipating device; and
   an encapsulant covering only an exposed portion of the thermal interface.

2. The apparatus of claim 1, wherein the heat generating device comprises an integrated circuit (IC).

3. The apparatus of claim 1, wherein the heat generating device comprises a processor.

4. The apparatus of claim 1, wherein the heat dissipating device comprises a heat sink.

5. The apparatus of claim 1, wherein the encapsulant comprises a rigid material.

6. The apparatus of claim 1, wherein the encapsulant comprises a soft and flexible material.

7. The apparatus of claim 1, wherein the encapsulant comprises a highly viscous grease oil.

8. The apparatus of claim 1, wherein the encapsulant is to protect the thermal interface from an ambient air and a moisture.

9. The apparatus of claim 1, wherein the heat generating device comprises a chipset.

10. The apparatus of claim 3, wherein the processor comprises a graphics processor.

11. The apparatus of claim 1, wherein the encapsulant partially encapsulates the heat generating device and the heat dissipating device.

12. A method, comprising:
    mounting a thermal interface between a heat generating device and a heat dissipating device;
    encapsulating only an exposed portion of the thermal interface in an encapsulant to protect the thermal interface.

13. The method of claim 12, wherein the heat generating device comprises a processor.

14. The method of claim 12, wherein the encapsulating further includes partially encapsulating the heat generating device and the heat dissipating device.

15. The method of claim 12, wherein the heat dissipating device comprises a heat sink.

16. The method of claim 12, wherein encapsulating further includes encapsulating to protect the thermal interface from an ambient air and a moisture.

17. The method of claim 12, wherein encapsulating includes encapsulating the thermal interface in a rigid material.

18. The method of claim 12, wherein encapsulating includes encapsulating the thermal interface in a soft and flexible material.

19. The method of claim 12, wherein encapsulating includes encapsulating the thermal interface in a highly viscous grease oil.

20. The method of claim 12, wherein encapsulating comprises applying the encapsulant using a brush.

21. The method of claim 12, wherein encapsulating comprises applying the encapsulant using a squeeze-tube.

22. The method of claim 12, wherein encapsulating comprises applying the encapsulant using a spray.

23. A system, comprising:
    a heat sink or a heat pipe;
    a heat generating device coupled to the heat sink or the heat pipe;
    a thermal interface coupled between the heat generating device and the heat sink or the heat pipe; and
    an encapsulant covering only an exposed portion of the thermal interface to protect the thermal interface.

24. The system of claim 23, wherein the encapsulant comprises a soft and flexible material.

25. The system of claim 23, wherein the encapsulant comprises a highly viscous grease.

* * * * *